United States Patent
Zhu et al.

(10) Patent No.: US 8,553,371 B2
(45) Date of Patent: Oct. 8, 2013

(54) TMR READER WITHOUT DLC CAPPING STRUCTURE

(75) Inventors: Honglin Zhu, Fremont, CA (US); Liubo Hong, San Jose, CA (US); Hicham M. Sougrati, Burlingame, CA (US); Quang Le, San Jose, CA (US); Jui-Lung Li, San Jose, CA (US); Chando Park, Palo Alto, CA (US)

(73) Assignee: HGST Netherlands B.V., Amsterdam (NL)

( * ) Notice: Subject to any disclaimer, the term of this patent is extended or adjusted under 35 U.S.C. 154(b) by 261 days.

(21) Appl. No.: 12/954,508

(22) Filed: Nov. 24, 2010

(65) Prior Publication Data

US 2012/0127616 A1    May 24, 2012

(51) Int. Cl.
*G11B 5/39* (2006.01)

(52) U.S. Cl.
USPC .................................. 360/324.2; 360/319

(58) Field of Classification Search
USPC .......... 360/319, 324.1, 324.11, 324.12, 324.2
See application file for complete search history.

(56) References Cited

U.S. PATENT DOCUMENTS

| | | |
|---|---|---|
| 6,501,619 B1 | 12/2002 | Sherrer et al. |
| 6,989,972 B1 | 1/2006 | Stoev et al. |
| 7,038,882 B2 | 5/2006 | Crue et al. |
| 7,075,756 B1 | 7/2006 | Mallary et al. |
| 7,140,095 B2 | 11/2006 | Matono |
| 7,159,302 B2 | 1/2007 | Feldbaum et al. |
| 7,251,878 B2 | 8/2007 | Le et al. |
| 7,253,992 B2 | 8/2007 | Chen et al. |
| 7,375,925 B2 | 5/2008 | Sasaki et al. |
| 7,392,577 B2 | 7/2008 | Yazawa et al. |
| 7,417,824 B2 | 8/2008 | Kameda |
| 7,561,384 B2 | 7/2009 | Osugi et al. |
| 7,623,324 B2 | 11/2009 | Honda et al. |
| 7,869,166 B2 * | 1/2011 | Miyauchi et al. ........ 360/324.11 |
| 8,296,930 B2 * | 10/2012 | Funada et al. ............. 29/603.14 |
| 2004/0179312 A1 * | 9/2004 | Freitag et al. ........... 360/324.12 |
| 2004/0240124 A1 * | 12/2004 | Sbiaa ....................... 360/324.11 |
| 2006/0114615 A1 * | 6/2006 | Pinarbasi ..................... 360/322 |
| 2006/0187581 A1 | 8/2006 | Nara et al. |
| 2006/0279882 A1 | 12/2006 | Honda et al. |
| 2007/0217069 A1 | 9/2007 | Okada et al. |
| 2007/0253117 A1 | 11/2007 | Takei et al. |
| 2008/0112081 A1 | 5/2008 | Matono |
| 2008/0124581 A1 * | 5/2008 | Miura et al. ............... 428/811.1 |
| 2008/0155810 A1 | 7/2008 | Hong et al. |

(Continued)

FOREIGN PATENT DOCUMENTS

| | | |
|---|---|---|
| JP | 2006147023 A | 6/2006 |
| JP | 2009048719 A | 8/2009 |

(Continued)

*Primary Examiner* — Jefferson Evans
(74) *Attorney, Agent, or Firm* — Patterson & Sheridan, LLP

(57) ABSTRACT

Embodiments herein generally relate to TMR readers and methods for their manufacture. The embodiments discussed herein disclose TMR readers that utilize a structure that avoids use of the DLC layer over the sensor structure and over the hard bias layer. The capping structure over the sensor structure functions as both a protective layer for the sensor structure and a CMP stop layer. The hard bias capping structure functions as both a protective structure for the hard bias layer and as a CMP stop layer. The capping structures that are free of DLC reduce the formation of notches in the second shield layer so that second shield layer is substantially flat.

18 Claims, 4 Drawing Sheets

(56) References Cited

U.S. PATENT DOCUMENTS

| | | |
|---|---|---|
| 2008/0239567 A1 | 10/2008 | Sasaki et al. |
| 2008/0239585 A1 | 10/2008 | Ousugi et al. |
| 2008/0253035 A1 | 10/2008 | Han et al. |
| 2008/0259498 A1 | 10/2008 | Lengsfield et al. |
| 2008/0266710 A1 | 10/2008 | Kameda et al. |
| 2008/0266724 A1 | 10/2008 | Yazawa et al. |
| 2008/0278853 A1 | 11/2008 | Kameda et al. |
| 2008/0278861 A1 | 11/2008 | Jiang et al. |
| 2008/0278862 A1 | 11/2008 | Kameda et al. |
| 2009/0002885 A1 | 1/2009 | Sin |
| 2009/0122445 A1 | 5/2009 | Jiang et al. |
| 2009/0141406 A1 | 6/2009 | Sasaki et al. |
| 2009/0147410 A1 | 6/2009 | Jiang et al. |
| 2009/0152119 A1 | 6/2009 | Tachibana et al. |
| 2009/0154019 A1 | 6/2009 | Hsiao et al. |
| 2009/0207533 A1* | 8/2009 | Shimazawa ................ 360/324.1 |
| 2009/0207534 A1* | 8/2009 | Miyauchi et al. ........ 360/324.11 |
| 2009/0244789 A1 | 10/2009 | Hong et al. |
| 2009/0266790 A1 | 10/2009 | Balamane et al. |
| 2009/0283205 A1 | 11/2009 | Miyazawa et al. |
| 2010/0024201 A1 | 2/2010 | Le et al. |
| 2011/0102949 A1* | 5/2011 | Yuan et al. ................. 360/324.2 |

FOREIGN PATENT DOCUMENTS

| | | |
|---|---|---|
| JP | 2009187612 A | 8/2009 |
| JP | 2009199712 A | 9/2009 |
| JP | 2009224000 A | 10/2009 |
| JP | 2009238261 A | 10/2009 |
| JP | 2010033621 A | 2/2010 |
| JP | 2010061735 A | 3/2010 |

* cited by examiner

TMR READER WITHOUT DLC CAPPING STRUCTURE

BACKGROUND OF THE INVENTION

1. Field of the Invention

Embodiments of the present invention generally relate to a tunnelling magnetoresistive (TMR) reader and a method for its manufacture.

2. Description of the Related Art

TMR readers are used in hard disk drives to read bits of data from the hard disk drive. An example of a TMR reader is shown in FIGS. 1A and 1B. The TMR reader 100 includes a first shield layer 102 and a sensor structure including a pinned layer 104, a barrier layer 106, a free layer 108 and a cap layer 110. The sensor structure may be fabricated by depositing all of the layers of the sensor structure and then depositing a diamond-like carbon (DLC) layer 112 thereover. A photoresist mask is then formed over the DLC layer. The DLC layer 112, as well as the layers of the sensor structure, are then patterned to form the sensor structure shown in FIG. 1A. During the etching, material from the various layers of the sensor structure may redeposit on the photoresist mask.

While the photoresist mask and DLC layer 112 are still present, an insulating layer 114 is deposited on top of the exposed first shield layer 102 and the sidewalls of the sensor structure. A hard bias layer 116 and a hard bias capping layer 118 are formed over the insulating layer 114. A second DLC layer 120 is formed over the exposed insulating layer 114, hard bias layer 116 and hard bias capping layer 118. The second DLC layer 120 and the first DLC layer 112 are used as chemical mechanical polishing (CMP) stop layers to protect the hard bias layer 116 and sensor structure during a CMP lift-off process that occurs later. The first and second DLC layers 112, 120 may have different thicknesses.

The DLC layers 112, 120 have several drawbacks. First, the first and second DLC layers 112, 120 are deposited in a tool that is separate from the tool used to deposit the hard bias capping layer 118 and the cap layer 110. Thus, depositing the DLC layers 112, 120 add process complication and increase the cost of manufacturing the TMR reader. Second, the DLC layers 112, 120 are typically removed using a reactive ion etching (RIE) process which adds process complication and cost. Third, the DLC layers 112, 120 may delaminate during the CMP process and thus could result in overpolishing of the TMR reader which leads to poor device performance. Finally, the different thicknesses of the DLC layers 112, 120 may make it difficult to achieve a truly planarized second shield layer 112 (See FIG. 1B) and thus result in a notch 124 in the second shield layer 122.

SUMMARY OF THE INVENTION

The present invention generally relates to a TMR reader and a method for its manufacture. During the manufacture of a TMR reader, a DLC layer may be used as a CMP stop layer. The DLC layer is typically disposed over capping layers that are used to protect the hard bias layer and the sensor structure. The DLC layer can cause complications such as increased processing time and cost. The embodiments discussed herein disclose TMR readers that utilize a much simpler structure that replaces not only the DLC layer, but also the capping layer, which saves processing time and cost.

In one embodiment, a method includes forming a sensor structure over a first shield layer. The sensor structure has a top surface and sidewalls. The method also includes depositing a first insulating layer over the first shield layer and the sidewalls of the sensor structure, depositing a hard bias layer over the first insulating layer, and forming a hard bias capping structure over the hard bias layer. The hard bias capping structure is free of DLC. In one embodiment, the hard bias capping structure is selected from the group consisting of: a first multiple layer structure comprising a tantalum layer formed on the hard bias layer and an iridium layer formed on the tantalum layer, a second multiple layer structure comprising an iridium layer formed on the hard bias layer and a layer of either tantalum or chromium or ruthenium formed on the iridium layer, a third multiple layer structure comprising a rhodium layer formed on the hard bias layer and a layer of either tantalum or chromium or ruthenium formed on the rhodium layer, and an iridium layer formed on the hard bias layer. The method also includes depositing a second shield layer over the sensor structure and the hard bias capping structure.

In another embodiment, a method includes forming a sensor structure over a first shield layer. The sensor structure has a top surface and sidewalls. The sensor structure additionally has a pinned layer disposed on the first shield layer, a barrier layer disposed on the pinned layer, a free layer disposed on the barrier layer, and a capping layer structure disposed on the barrier layer. The capping layer structure is free of DLC. In one embodiment, the capping layer structure is selected from the group consisting of an iridium layer deposited on the barrier layer, a rhodium layer deposited on the barrier layer, an iridium layer deposited on the barrier layer and a rhodium layer deposited on the iridium layer, and a rhodium layer deposited on the barrier layer and an iridium layer deposited on the rhodium layer. The method also includes depositing a first insulating layer over the first shield layer and the sidewalls of the sensor structure, depositing a hard bias layer over the first insulating layer, forming a hard bias capping structure over the hard bias layer, and depositing a second shield layer over the sensor structure and the hard bias capping structure.

In another embodiment, a TMR reader includes a first shield layer having a first portion and a second portion, a sensor structure disposed over the first portion of the first shield layer and having a top surface and sidewalls, an insulating layer disposed over the second portion of the first shield layer and the sidewalls, a hard bias layer disposed over the insulating layer, and a hard bias capping structure disposed over the hard bias layer. The hard bias capping structure is free of DLC. In one embodiment, the hard bias capping structure is selected from the group consisting of a first multiple layer structure comprising a tantalum layer formed on the hard bias layer and an iridium layer formed on the tantalum layer, a second multiple layer structure comprising an iridium layer formed on the hard bias layer and a layer of either tantalum or chromium or ruthenium formed on the iridium layer, a third multiple layer structure comprising a rhodium layer formed on the hard bias layer and a layer of either tantalum or chromium or ruthenium formed on the rhodium layer, and an iridium layer formed on the hard bias layer. The TMR reader also includes a second shield layer over the sensor structure and the hard bias capping structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A and 1B are schematic cross-sectional views of a prior art TMR magnetic read sensor.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments disclosed herein generally relate to TMR readers and methods for their manufacture. During the manufacture of a TMR reader, a DLC layer may be used as a CMP stop layer. The DLC layer is typically disposed over capping layers that are used to protect the hard bias layer and the sensor structure. The DLC layer can cause complications such as increased processing time and cost. The embodiments discussed herein disclose TMR readers that utilize a much simpler structure that replaces not only the DLC layer, but also the capping layer, which saves processing time and cost.

Hard Bias Capping Structure

Figure 2A:
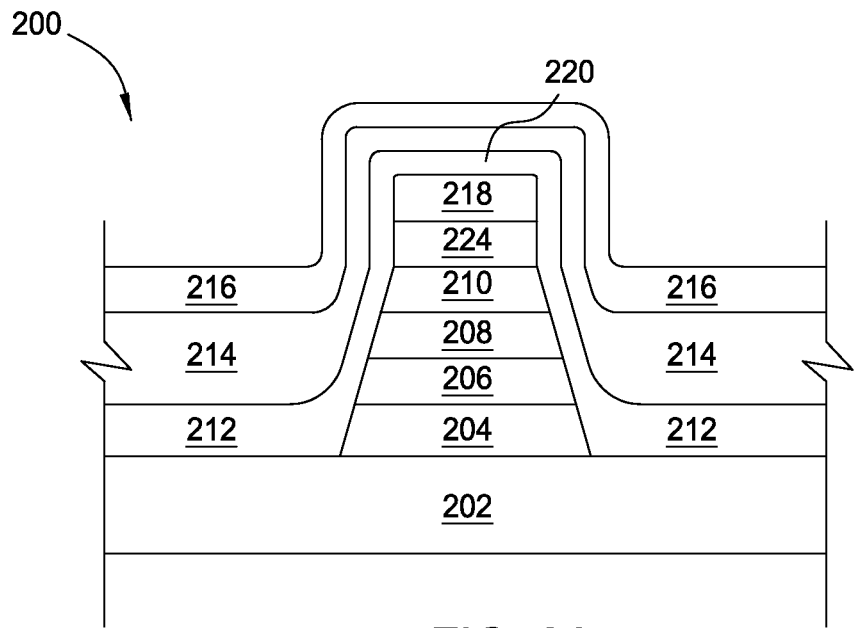
FIGS. 2A and 2B are schematic cross-sectional views of a TMR magnetic read sensor according to one embodiment.
Figure 2B:
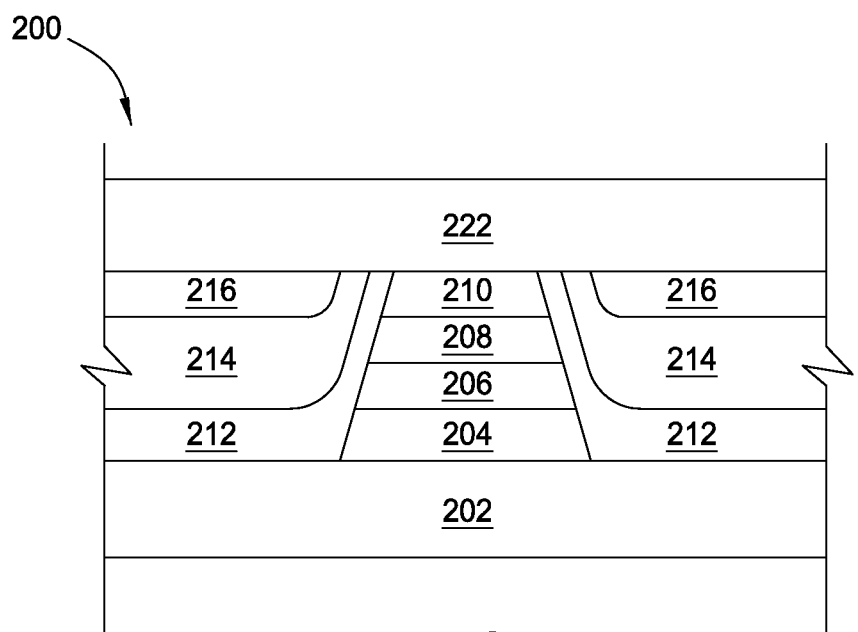

FIGS. 2A and 2B are schematic cross-sectional views of a TMR magnetic read sensor 200 according to one embodiment. The magnetic read sensor 200 includes a first shield layer 202. The first shield layer 202 may comprise a ferromagnetic material. Suitable ferromagnetic materials that may be utilized include Ni, Fe, Co, NiFe, NiFeCo, NiCo, CoFe and combinations thereof.

The magnetic read sensor 200 also includes a sensor structure comprising a pinned magnetic layer 204, a barrier layer 206, a free magnetic layer 208 and a capping layer 210. The pinned magnetic layer 204 may be one of several types of pinned layers, such as a simple pinned, antiparallel pinned, self pinned or antiferromagnetic pinned sensor. For purposes of simplicity, the sensor will be described herein as an antiparallel pinned, antiferromagnetic pinned sensor having a first antiparallel layer, a second antiparallel layer, and a non-magnetic, antiferromagnetic coupling layer, such as Ru sandwiched therebetween. The first and second antiparallel layers can be constructed of several magnetic materials such as, for example NiFe or CoFe, and have magnetic moments that are pinned by exchange coupling of the first antiparallel layer with a layer of antiferromagnetic layer. The antiferromagnetic layer may include materials such as PtMn, iridium, or rhodium. The barrier layer 206 may comprise an insulating material such as alumina or magnesium oxide. The free magnetic layer 208 may comprise ferromagnetic material such as Co, CoFe, NiFe or combinations thereof. The cap layer 210 may comprise a material to protect the sensor from damage such as ruthenium or tantalum.

The layers of the sensor structure may be blanket deposited and then etched back. To etch back the layers, a diamond like carbon (DLC) layer 224 and a photoresist mask 218 may be formed thereover. The DLC layer 224 is used to protect the sensor structure during a CMP process. The layers of the sensor structure may then be etched in the areas not covered by the photoresist mask 218. During the etching, material removed from the sensor structure may deposit on the photoresist mask as a hard, crust layer 220.

Following the formation of the sensor structure, an insulating layer 212 may be deposited on the first shield layer 202 as well as the sidewalls of the sensor structure. The insulating layer 212 may comprise an insulating material such as aluminum oxide. The insulating layer 212 may be deposited by well known deposition methods such as atomic layer deposition (ALD), chemical vapor deposition (CVD), sputtering, etc. After the insulating layer 212 is deposited, a hard bias layer 214 is then deposited. The hard bias layer 214 may comprise a material having a high magnetic moment such as CoFe.

Once the hard bias layer 214 is deposited, the new hard bias capping structure 216 may be formed. In a first embodiment, the new hard bias capping structure 216 may comprise a multiple layer structure comprising a first tantalum layer, an iridium layer, and a second tantalum layer. The first tantalum layer may be deposited to a thickness of up to about 20 Angstroms and functions as a glue layer for the iridium layer. The iridium layer may be deposited to a thickness of between about 20 Angstroms and about 150 Angstroms. The second tantalum layer may be deposited to a thickness of between about 20 Angstroms and about 150 Angstroms. The second tantalum layer provides a planarization after a CMP step that will be described later for removing the photoresist mask 218. The second tantalum layer also is used for glancing milling consumption for a touch CMP lift-off based process that is used to remove the photoresist mask 218 in a later step. Other materials that may be used for the second tantalum layer instead of tantalum include chromium or ruthenium.

In a second embodiment, the new hard bias capping structure 216 may comprise a first glue layer of tantalum having a thickness of up to about 20 Angstroms. The first glue layer is deposited on the hard bias layer 214. Over the first glue layer, a layer of iridium is deposited to a thickness of between about 20 Angstroms and about 150 Angstroms. The iridium or rhodium layer is used as a CMP stop layer when removing the photoresist mask 218.

In a third embodiment, the new hard bias capping structure 216 may comprise a two layer structure in which the first layer comprises iridium or rhodium and is deposited on the hard bias layer 214. The first layer may have a thickness of between about 20 Angstroms and about 150 Angstroms. The second layer is deposited on the first layer and may comprise tantalum, chromium or ruthenium. The second layer may be deposited to a thickness of between about 20 Angstroms and about 150 Angstroms.

In a fourth embodiment, the new hard bias capping structure 216 may comprise a single layer of iridium having a thickness of between about 20 Angstroms and about 150 Angstroms.

The fabrication process may proceed according to several embodiments. In a first process embodiment, the sensor structure is formed over the first shield layer 202. The insulating layer 212 and hard bias layer 216 are then formed. The hard bias capping structure 216 of either the first embodiment, the second embodiment, or the third embodiment is then deposited. The second and fourth embodiments are not utilized in the first process embodiment because the second and fourth embodiments have iridium as the topmost layer in the hard bias capping structure 216. The hard bias capping structure 216 may be deposited by a sputtering method. Due to the hard, crust layer 220, a glancing mill process may be performed to open the photoresist mask 218. The photoresist mask 218 may then be removed by rinsing the photoresist mask 218 in a solution and performing a CMP process. The DLC layer 224 may be removed by an RIE process. A touch CMP process is then performed to remove fencing and provide some planarization of the hard bias capping structure 216 as well as the cap layer 210. A second shield layer 222 is then deposited. The second shield layer 222 may comprise a ferromagnetic material. Suitable ferromagnetic materials that may be utilized include Ni, Fe, Co, NiFe, NiFeCo, NiCo, CoFe and combinations thereof.

In a second process embodiment, the sensor structure is formed over the first shield layer 202. The insulating layer 212 and hard bias layer 216 are then formed. The hard bias capping structure 216 of any of the first through fourth embodiment is then deposited. A wrinkle baking process is performed to expand the photoresist mask 218 and crack the hard, crust layer 220. The photoresist mask 218 is then removed by dipping the photoresist mask 218 in a solution and performing a CMP process. The DLC layer 224 may be removed by an RIE process. A CMP process is then performed to remove any fencing and to provide some planarization of the hard bias capping structure 216 as well as the cap layer 210. A second shield layer 222 is then deposited.

Figure 1A:
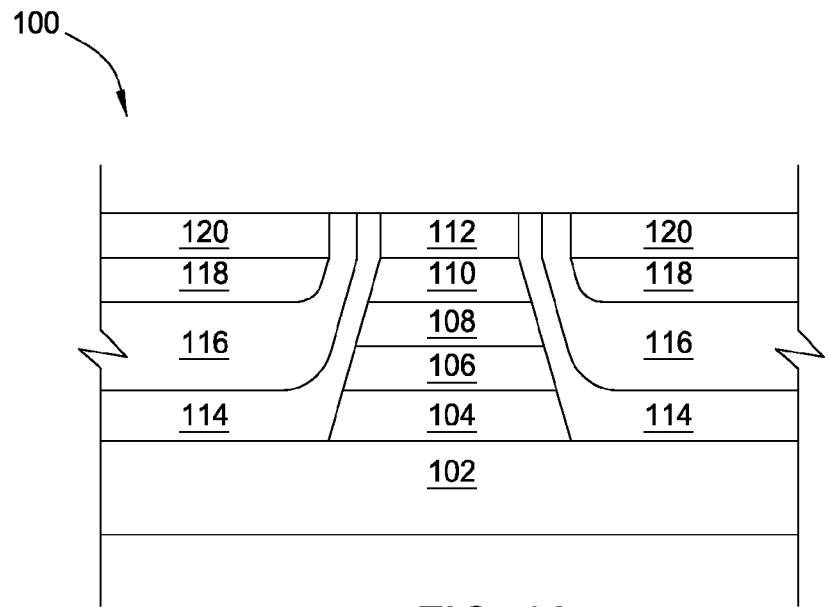
Figure 1B:
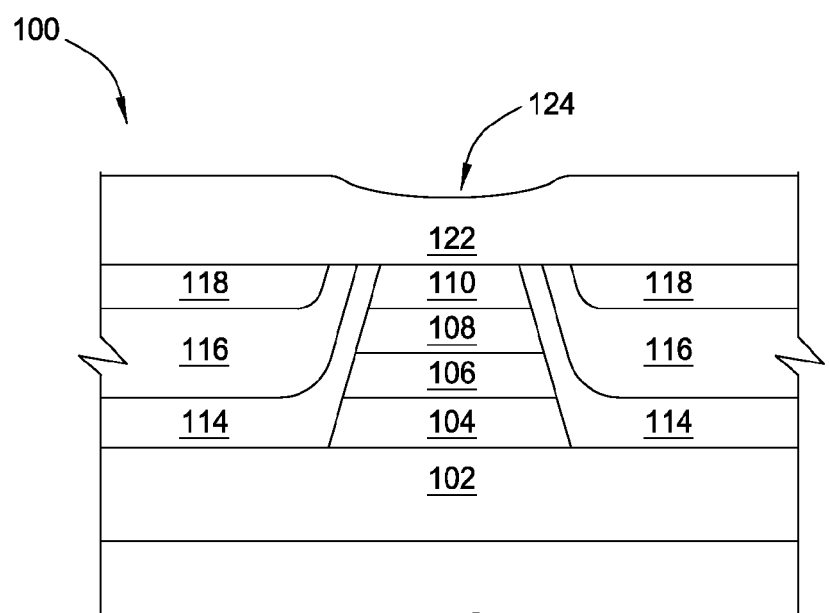

Thus, in the embodiment shown in FIGS. 2A-2B, no DLC layer is utilized over the hard bias layer 214 or the hard bias capping structure 216. The four embodiments discussed above replace the hard bias capping layer 118 and DLC layer 120 shown in FIG. 1A.

Sensor Structure Capping Structure

Figure 3A:
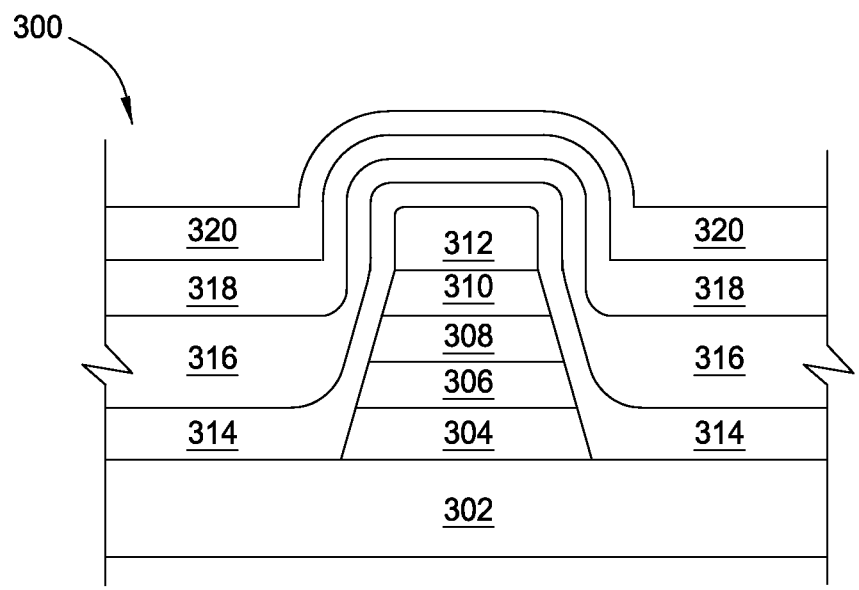
FIGS. 3A and 3B are schematic cross-sectional views of a TMR magnetic read sensor according to another embodiment.
Figure 3B:
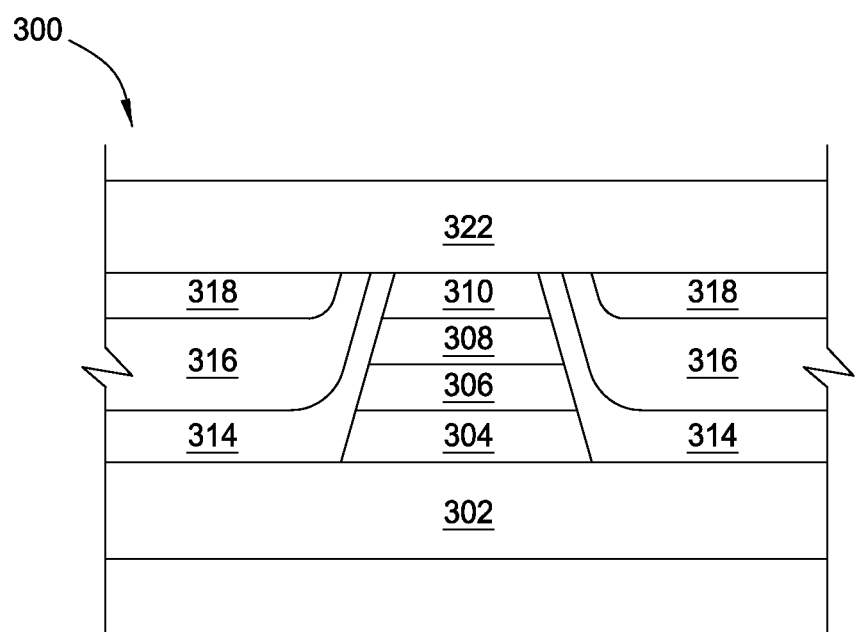

FIGS. 3A and 3B are schematic cross-sectional views of a TMR magnetic read sensor 300 according to another embodiment. The magnetic read sensor 300 includes a first shield layer 302. The first shield layer 302 may comprise the same materials as discussed above in regards to the first shield layer 202 of sensor 200.

The magnetic read sensor 300 also includes a sensor structure comprising a pinned magnetic layer 304, a barrier layer 306, a free magnetic layer 308 and a capping structure 310. The pinned magnetic layer 304, barrier layer 306 and free magnetic layer 308 may comprise materials as discussed above in regards to layers 204, 206, 208. The capping structure 310 may be deposited over the free magnetic layer 308. In a first embodiment, the capping structure 310 may comprise an iridium layer deposited on the free magnetic layer 308. In a second embodiment, the capping structure 310 may comprise a rhodium layer deposited on the free magnetic layer 308. In a third embodiment, the capping structure 310 may comprise a bottom layer of iridium deposited on the free magnetic layer 308 and a top layer of rhodium deposited on the bottom layer of iridium. In a fourth embodiment, the capping structure 310 may comprise a bottom layer of rhodium deposited on the free magnetic layer 308 and a top layer of iridium deposited on the bottom layer of rhodium. The capping structure 310 may have a thickness of between about 20 Angstroms and about 150 Angstroms. The capping structure 310 does not include a DLC layer. The capping structure 310 operates as a CMP stop layer to protect the sensor structure during the lift-off of the photoresist mask 312.

Once the layers of the sensor structure have been deposited and etched, an insulating layer 314, a hard bias layer 316 and a hard bias capping layer 318 may be deposited. A DLC layer 320 may be deposited over the hard bias capping layer 318. Once the DLC layer 320 and the photoresist mask 312 are removed, a second shield layer 322 is deposited. The materials for the second shield layer 322 may comprise the same materials as discussed above for second shield layer 222.

The fabrication process may proceed according to any of several embodiments. In a first process embodiment, the sensor structure is formed over the first shield layer 302. The photoresist mask 312 is then formed without first depositing a DLC layer over the capping structure 310. The sensor structure is then etched. The insulating layer 314 and hard bias layer 316 are then formed. The hard bias capping layer 318 is then deposited. Due to the hard, crust layer that may form on the photoresist mask 312, a glancing mill process may be performed to open the photoresist mask 312. The photoresist mask 312 may then be removed by rinsing the photoresist mask 312 in a solution and performing a CMP process. The DLC layer 320 may be removed by an RIE process. A CMP process is then performed provide some planarization of the hard bias capping layer 318 as well as the capping structure 310. The second shield layer 322 is then deposited.

In a second process embodiment, the sensor structure is formed over the first shield layer 302. The photoresist mask 312 is then formed without first depositing a DLC layer over the capping structure 310. The sensor structure is then etched. The insulating layer 314 and hard bias layer 316 are then formed. The hard bias capping layer 318 is then deposited. A wrinkle baking process is performed to expand the photoresist mask 312 and crack the hard, crust layer. The photoresist mask 312 is then removed by dipping the photoresist mask 312 in a solution and performing a CMP process. The DLC layer 320 may be removed by an RIE process. A CMP process is then performed to provide some planarization of the hard bias capping structure 318 as well as the capping structure 310. The second shield layer 222 is then deposited.

Thus, in the embodiment shown in FIGS. 3A-3B, no DLC layer is utilized over the sensor structure. The capping structure 310 replace the capping layer 110 and DLC layer 112 shown in FIG. 1A.

Hard Bias and Sensor Structure Capping

Figure 4A:
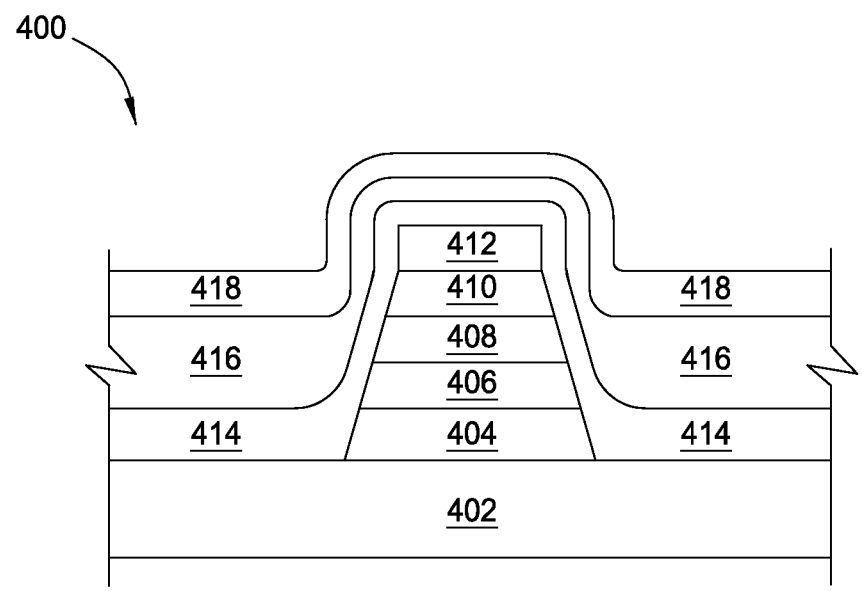
FIGS. 4A and 4B are schematic cross-sectional views of a TMR magnetic read sensor according to another embodiment.
Figure 4B:
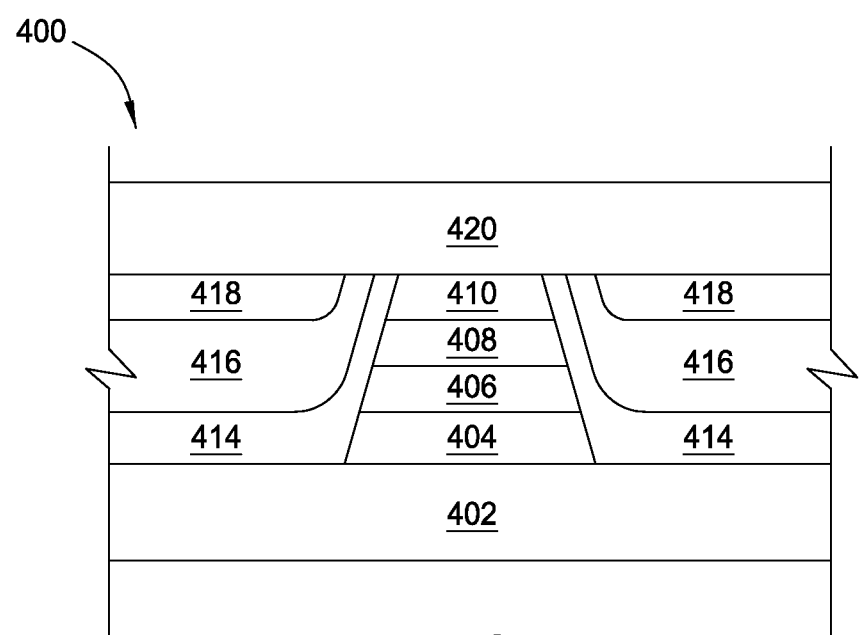

In another embodiment, the elimination of both DLC layers 112, 120 is contemplated. FIGS. 4A and 4B are schematic cross-sectional views of a TMR magnetic read sensor 400 according to another embodiment in which no DLC layer is utilized. The magnetic read sensor 400 includes a first shield layer 402. The first shield layer 402 may comprise the same materials as discussed above in regards to the first shield layer 202 of sensor 200.

The magnetic read sensor 400 also includes a sensor structure comprising a pinned magnetic layer 404, a barrier layer 406, a free magnetic layer 408 and a capping structure 410. The pinned magnetic layer 404, barrier layer 406 and free magnetic layer 408 may comprise materials as discussed above in regards to layers 404, 406, 408. The capping structure 410 may be deposited over the free magnetic layer 408. In a first embodiment, the capping structure 410 may comprise an iridium layer deposited on the free magnetic layer 408. In a second embodiment, the capping structure 410 may comprise a rhodium layer deposited on the free magnetic layer 408. In a third embodiment, the capping structure 410 may comprise a bottom layer of iridium deposited on the free magnetic layer 408 and a top layer of rhodium deposited on the bottom layer of iridium. In a fourth embodiment, the capping structure 410 may comprise a bottom layer of rhodium deposited on the free magnetic layer 408 and a top layer of iridium deposited on the bottom layer of rhodium. The capping structure 410 may have a thickness of between about 20 Angstroms and about 150 Angstroms. The capping structure 410 does not include a DLC layer. The capping structure 410 operates as a CMP stop layer to protect the sensor structure during the lift-off of the photoresist mask 412.

Once the layers of the sensor structure have been deposited and etched, an insulating layer 414, a hard bias layer 416 and a hard bias capping structure 418 may be deposited. A DLC layer is not utilized over the hard bias capping structure 418.

In a first embodiment, the hard bias capping structure 418 may comprise a multiple layer structure comprising a first tantalum layer, an iridium layer, and a second tantalum layer. The first tantalum layer may be deposited to a thickness of up to about 20 Angstroms and functions as a glue layer for the iridium layer. The iridium layer may be deposited to a thickness of between about 20 Angstroms and about 150 Angstroms. The second tantalum layer may be deposited to a thickness of between about 20 Angstroms and about 150 Angstroms. The second tantalum layer provides a planarization after a chemical mechanical polishing (CMP) step that will be described later for removing the photoresist mask 412. The second tantalum layer also is used for glancing milling consumption for a touch CMP lift-off based process that is used to remove the photoresist mask 412 in a later step. Other materials that may be used for the second tantalum layer instead of tantalum include chromium or ruthenium.

In a second embodiment, the hard bias capping structure 418 may comprise a first glue layer of tantalum having a thickness of up to about 20 Angstroms. The first glue layer is deposited on the hard bias layer 416. Over the first glue layer, a layer of iridium is deposited to a thickness of between about 20 Angstroms and about 150 Angstroms. The iridium layer is used as a CMP stop layer when removing the photoresist mask 412.

In a third embodiment, the hard bias capping structure 418 may comprise a two layer structure in which the first layer comprises iridium or rhodium and is deposited on the hard bias layer 416. The first layer may have a thickness of between about 20 Angstroms and about 150 Angstroms. The second layer is deposited on the first layer and may comprise tantalum, chromium or ruthenium. The second layer may be deposited to a thickness of between about 20 Angstroms and about 150 Angstroms.

In a fourth embodiment, the hard bias capping structure 418 may comprise a single layer of iridium having a thickness of between about 20 Angstroms and about 150 Angstroms.

The fabrication process may proceed according to several embodiments. In a first process embodiment, the sensor structure is formed over the first shield layer 402. The photoresist mask 412 is then formed without first depositing a DLC layer over the capping structure 410. The sensor structure is then etched. The insulating layer 414 and hard bias layer 416 are then formed. The hard bias capping structure 418 of either the first embodiment or the third embodiment is then deposited without utilizing a DLC layer. The second and fourth embodiments are not utilized in the first process embodiment because the second and fourth embodiments have iridium as the topmost layer in the hard bias capping structure 418. The hard bias capping structure 418 may be deposited by a sputtering method. A glancing mill process may be performed to open the photoresist mask 412. The photoresist mask 412 may then be removed by rinsing the photoresist mask 412 in a solution and performing a CMP process. A touch CMP process is then performed to remove fencing and provide some planarization of the hard bias capping structure 418 as well as the cap structure 410. The second shield layer 420 is then deposited.

In a second process embodiment, the sensor structure is formed over the first shield layer 402. The photoresist mask 412 is then formed without first depositing a DLC layer over the capping structure 410. The sensor structure is then etched. The insulating layer 414 and hard bias layer 416 are then formed. The hard bias capping structure 418 of any of the first through fourth embodiment is then deposited without utilizing a DLC layer. A wrinkle baking process is performed to expand the photoresist mask 412 and crack the hard, crust layer. The photoresist mask 412 is then removed by dipping the photoresist mask 412 in a solution and performing a CMP process. A CMP process is then performed to remove any fencing and to provide some planarization of the hard bias capping structure 418 as well as the capping structure 410. The second shield layer 222 is then deposited.

Thus, in the embodiment shown in FIGS. 4A-4B, no DLC layers are utilized in the fabrication of the magnetic read sensor 400. The capping structure 410 replaces the capping layer 110 and DLC layer 112 shown in FIG. 1A. The hard bias capping structure 418 replaces both the hard bias capping layer 118 and the DLC layer 118 shown in FIG. 1A. A silicon adhesion layer may be utilized between the hard bias capping structure 418 and the hard bias layer 416 if desired. Similarly, a silicon adhesion layer may be utilized between the capping structure 410 and the free magnetic layer 408 if desired.

The same capping material may be used for both the capping structure 410 and the hard bias capping structure 418. Additionally, the iridium or rhodium may be used for the antiferromagnetic coupling layer in the pinned magnetic layer of the sensor structure. Thus, iridium or rhodium may be used for both the sensor itself and for the capping. The iridium or rhodium may be deposited from a sputtering target. By eliminating one or both DLC layers in a TMR magnetic read sensor, fabrication costs may be reduced.

While the foregoing is directed to embodiments of the present invention, other and further embodiments of the invention may be devised without departing from the basic scope thereof, and the scope thereof is determined by the claims that follow.

What is claimed is:
1. A TMR reader, comprising:
a first shield layer having a first portion and a second portion;
a sensor structure disposed over the first portion of the first shield layer and having a top surface and sidewalls;
an insulating layer disposed over the second portion of the first shield layer and the sidewalls;
a hard bias layer disposed over the insulating layer;
a hard bias capping structure disposed over the hard bias layer, the hard bias capping structure is free of diamond like carbon, wherein the hard bias capping structure selected from the group consisting of:
a first multiple layer structure comprising a tantalum layer formed on the hard bias layer and an iridium layer formed on the tantalum layer;

a second multiple layer structure comprising an iridium layer formed on the hard bias layer and a layer of either tantalum or chromium or ruthenium formed on the iridium layer;

a third multiple layer structure comprising a rhodium layer formed on the hard bias layer and a layer of either tantalum or chromium or ruthenium formed on the rhodium layer; and an iridium layer formed on the hard bias layer; and a second shield layer over the sensor structure and the hard bias capping structure.

2. The TMR reader of claim 1, wherein the hard bias capping layer structure comprises the first multiple layer structure and the first multiple layer structure comprises the tantalum layer formed on the hard bias layer, the iridium layer formed on the tantalum layer, and a tantalum or ruthenium or chromium layer formed on the iridium layer.

3. The TMR reader of claim 1, wherein the hard bias capping layer structure comprises the third multiple layer structure comprising a tantalum layer formed on the rhodium layer.

4. The TMR reader of claim 1, wherein the sensor structure further comprises:
    a pinned layer disposed over the first shield layer;
    a barrier layer disposed over the pinned layer;
    a free layer disposed over the barrier layer; and
    a sensor capping structure disposed over the barrier layer, the sensor capping structure selected from the group consisting of:
        an iridium layer deposited on the barrier layer;
        a rhodium layer deposited on the barrier layer;
        an iridium layer deposited on the barrier layer and a rhodium layer deposited on the iridium layer; and
        a rhodium layer deposited on the barrier layer and an iridium layer deposited on the rhodium layer.

5. The TMR reader of claim 4, wherein the pinned layer comprises a non-magnetic layer sandwiched between two magnetic layers.

6. The TMR reader of claim 5, wherein the non-magnetic layer comprises PtMn, iridium, or rhodium and the two magnetic layers comprise NiFe or CoFe.

7. The TMR reader of claim 4, wherein the barrier layer comprises alumina or magnesium oxide.

8. The TMR reader of claim 4, wherein the free layer comprises Co, CoFe, NiFe, or combination thereof.

9. A TMR reader, comprising:
    a first shield layer having a first portion and a second portion;
    a sensor structure disposed over the first portion of the first shield layer and having a top surface and sidewalls;
    an insulating layer disposed over the second portion of the first shield layer and the sidewalls;
    a hard bias layer disposed over the insulating layer;
    a hard bias capping structure disposed over the hard bias layer, the hard bias capping structure comprising more than one layer and is free of diamond like carbon,
    wherein the hard bias capping structure is selected from the group consisting of:
        a first multiple layer structure comprising a tantalum layer formed on the hard bias layer and an iridium layer formed on the tantalum layer;
        a second multiple layer structure comprising an iridium layer formed on the hard bias layer and a layer of either tantalum or chromium or ruthenium formed on the iridium layer; and
        a third multiple layer structure comprising a rhodium layer formed on the hard bias layer and a layer of either tantalum or chromium or ruthenium formed on the rhodium layer; and
    a second shield layer over the sensor structure and the hard bias capping structure.

10. The TMR reader of claim 9, wherein the hard bias capping layer structure comprises the first multiple layer structure and the first multiple layer structure comprises the tantalum layer formed on the hard bias layer, the iridium layer formed on the tantalum layer, and a tantalum or ruthenium or chromium layer formed on the iridium layer.

11. The TMR reader of claim 9, wherein the hard bias capping layer structure comprises the second multiple layer and the second multiple layer comprises the iridium layer formed on the hard bias layer and the layer of tantalum formed on the iridium layer.

12. The TMR reader of claim 9, wherein the hard bias capping layer structure comprises the third multiple layer structure comprising a tantalum layer formed on the rhodium layer.

13. The TMR reader of claim 9, wherein the sensor structure further comprises:
    a pinned layer disposed over the first shield layer;
    a barrier layer disposed over the pinned layer;
    a free layer disposed over the barrier layer; and
    a sensor capping structure disposed over the barrier layer, the sensor capping structure selected from the group consisting of:
        an iridium layer deposited on the barrier layer;
        a rhodium layer deposited on the barrier layer;
        an iridium layer deposited on the barrier layer and a rhodium layer deposited on the iridium layer; and
        a rhodium layer deposited on the barrier layer and an iridium layer deposited on the rhodium layer.

14. The TMR reader of claim 13, wherein the pinned layer comprises a non-magnetic layer sandwiched between two magnetic layers.

15. The TMR reader of claim 14, wherein the non-magnetic layer comprises PtMn, iridium, or rhodium and the two magnetic layers comprise NiFe or CoFe.

16. The TMR reader of claim 13, wherein the barrier layer comprises alumina or magnesium oxide.

17. The TMR reader of claim 13, wherein the free layer comprises Co, CoFe, NiFe, or combination thereof.

18. The TMR reader of claim 9, wherein the sensor structure further comprises:
    a pinned layer disposed over the first shield layer;
    a barrier layer disposed over the pinned layer;
    a free layer disposed over the barrier layer; and
    a sensor capping structure disposed over the barrier layer, the sensor capping structure selected from the group consisting of:
        an iridium layer deposited on the barrier layer;
        a rhodium layer deposited on the barrier layer;
        an iridium layer deposited on the barrier layer and a rhodium layer deposited on the iridium layer; and
        a rhodium layer deposited on the barrier layer and an iridium layer deposited on the rhodium layer.

* * * * *